United States Patent
Utz

(10) Patent No.: US 10,187,995 B2
(45) Date of Patent: *Jan. 22, 2019

(54) BOARD-MOUNTED CIRCUIT BREAKERS FOR ELECTRONIC EQUIPMENT ENCLOSURES

(71) Applicant: CHATSWORTH PRODUCTS, INC., Agoura Hills, CA (US)

(72) Inventor: James Utz, Round Rock, TX (US)

(73) Assignee: Chatsworth Products, Inc., Agoura Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/833,636

(22) Filed: Dec. 6, 2017

(65) Prior Publication Data

US 2018/0098429 A1    Apr. 5, 2018

Related U.S. Application Data

(63) Continuation of application No. 15/202,690, filed on Jul. 6, 2016, now Pat. No. 9,844,143, which is a
(Continued)

(51) Int. Cl.
*H05K 7/00* (2006.01)
*H05K 1/18* (2006.01)
(Continued)

(52) U.S. Cl.
CPC ............... *H05K 1/181* (2013.01); *H05K 1/18* (2013.01); *H05K 3/32* (2013.01); *H05K 3/325* (2013.01);
(Continued)

(58) Field of Classification Search
CPC ...... H04Q 1/062; H04Q 1/14; H04Q 2201/02; H05K 7/1492; H05K 3/32
See application file for complete search history.

(56) References Cited

U.S. PATENT DOCUMENTS 2,271,463 A    1/1942  Reeves
3,054,025 A    9/1962  Edmunds
(Continued)

FOREIGN PATENT DOCUMENTS

EP    646811 A2    4/1995
EP    1557910 A1   7/2005
(Continued)

OTHER PUBLICATIONS

Information Disclosure Statement (IDS) Letter Regarding Common Patent Application(s), dated Feb. 28, 2018.
(Continued)

*Primary Examiner* — Robert J Hoffberg
*Assistant Examiner* — Hung Dang
(74) *Attorney, Agent, or Firm* — Tillman Wright, PLLC; James D. Wright; David R. Higgins

(57) ABSTRACT

A board-mounted circuit breaker assembly for an electronic equipment enclosure includes a printed circuit board having a plurality of quick-connect terminals and a circuit breaker. The circuit breaker includes a housing and a plurality of quick-connect terminals that are at least partially recessed into a portion of the housing to reduce the overall "z"-height of the circuit breaker. The quick-connect terminals on the circuit breaker are adapted to mechanically and electrically connect to the quick-connect terminals on the printed circuit board.

20 Claims, 6 Drawing Sheets

Related U.S. Application Data continuation of application No. 13/751,117, filed on Jan. 27, 2013, now abandoned.

(60) Provisional application No. 61/591,342, filed on Jan. 27, 2012.

(51) Int. Cl.
*H05K 5/00* (2006.01)
*H05K 3/32* (2006.01)
*H05K 7/14* (2006.01)

(52) U.S. Cl.
CPC ......... *H05K 5/0026* (2013.01); *H05K 7/1492* (2013.01); *H05K 2201/10053* (2013.01); *Y10T 29/4913* (2015.01)

(56) References Cited

U.S. PATENT DOCUMENTS

| | | |
|---|---|---|
| 3,066,902 A | 12/1962 | Conil |
| 3,088,054 A | 4/1963 | Meyer |
| 3,202,788 A | 8/1965 | George |
| 3,263,132 A | 7/1966 | Bangert, Jr. |
| 3,295,905 A | 1/1967 | Sisk et al. |
| 3,569,909 A | 3/1971 | Garver |
| 3,573,716 A | 4/1971 | Garver |
| 3,633,075 A | 1/1972 | Hawkins |
| 3,910,671 A | 10/1975 | Townsend |
| 4,004,197 A | 1/1977 | Hawkes, Jr. |
| 4,015,397 A | 4/1977 | Flachbarth et al. |
| 4,046,957 A | 9/1977 | Taylor et al. |
| 4,675,900 A | 6/1987 | Temkin |
| 4,699,289 A | 10/1987 | You |
| 4,768,845 A | 9/1988 | Yeh |
| 4,782,245 A | 11/1988 | Henry |
| 5,011,427 A | 4/1991 | Martin |
| 5,104,335 A | 4/1992 | Conley et al. |
| 5,141,185 A | 8/1992 | Rumbold et al. |
| 5,149,026 A | 9/1992 | Allen |
| 5,158,476 A | 10/1992 | Kirby |
| 5,216,579 A | 6/1993 | Basara et al. |
| 5,295,041 A | 3/1994 | Metivier et al. |
| 5,326,934 A | 7/1994 | LeMaster et al. |
| 5,338,211 A | 8/1994 | Kodama et al. |
| 5,344,328 A | 9/1994 | Suggs |
| 5,347,430 A | 9/1994 | Curlee et al. |
| 5,370,553 A | 12/1994 | Zimmerman |
| 5,381,315 A | 1/1995 | Hamaguchi et al. |
| 5,391,084 A | 2/1995 | Krietzman |
| 5,443,312 A | 8/1995 | Schluter |
| 5,497,444 A | 3/1996 | Wheeler |
| 5,568,362 A | 10/1996 | Hansson |
| D375,292 S | 11/1996 | D'Amato |
| 5,595,494 A | 1/1997 | Wiebe |
| 5,609,402 A | 3/1997 | Kemp |
| 5,626,316 A | 5/1997 | Smigel et al. |
| 5,640,482 A | 6/1997 | Barry et al. |
| 5,758,002 A | 5/1998 | Walters |
| 5,788,087 A | 8/1998 | Orlando |
| 5,911,661 A | 6/1999 | Murray et al. |
| 5,921,795 A | 7/1999 | Weener et al. |
| 5,921,806 A | 7/1999 | Shuey |
| 5,961,081 A | 10/1999 | Rinderer |
| 6,008,621 A | 12/1999 | Madison et al. |
| 6,019,323 A | 2/2000 | Jette |
| 6,047,838 A | 4/2000 | Rindoks et al. |
| 6,127,631 A | 10/2000 | Green et al. |
| 6,164,582 A | 12/2000 | Vara |
| 6,201,687 B1 | 3/2001 | Murray |
| 6,220,880 B1 | 4/2001 | Lee et al. |
| 6,231,379 B1 | 5/2001 | Shen |
| 6,250,956 B1 | 6/2001 | Pulizzi |
| 6,259,604 B1 | 7/2001 | Kuster |
| 6,307,997 B1 | 10/2001 | Walters et al. |
| 6,315,580 B1 | 11/2001 | Hurtubise et al. |
| 6,318,680 B1 | 11/2001 | Benedict et al. |
| 6,326,547 B1 | 12/2001 | Saxby et al. |
| 6,327,139 B1 | 12/2001 | Champion et al. |
| 6,332,594 B2 | 12/2001 | Shelton et al. |
| 6,347,493 B1 | 2/2002 | Jette |
| 6,353,532 B1 | 3/2002 | Landrum et al. |
| 6,364,718 B1 | 4/2002 | Polgar et al. |
| 6,373,721 B2 | 4/2002 | Lecinski et al. |
| 6,403,885 B1 | 6/2002 | Baker et al. |
| D462,056 S | 8/2002 | Chung |
| 6,449,912 B2 | 9/2002 | Jette |
| 6,461,052 B1 | 10/2002 | Hines et al. |
| 6,481,678 B1 | 11/2002 | Chong |
| 6,494,411 B1 | 12/2002 | Bjorklund |
| 6,513,764 B2 | 2/2003 | Koziol |
| 6,541,705 B1 | 4/2003 | McGrath |
| 6,605,782 B1 | 8/2003 | Krietzman et al. |
| 6,614,665 B2 | 9/2003 | Witty et al. |
| 6,629,675 B1 | 10/2003 | Bjorklund et al. |
| 6,637,165 B2 | 10/2003 | Jette |
| 6,663,435 B2 | 12/2003 | Lincoln et al. |
| 6,672,896 B1 | 1/2004 | Li |
| 6,728,461 B1 | 4/2004 | Senatore et al. |
| 6,760,531 B1 | 7/2004 | Solheid et al. |
| 6,781,491 B2 | 8/2004 | Whipple et al. |
| 6,782,617 B2 | 8/2004 | Pulizzi |
| 6,884,942 B2 | 4/2005 | McGrath et al. |
| 6,937,461 B1 | 8/2005 | Donahue, IV |
| 6,981,893 B2 | 1/2006 | Barker et al. |
| 7,043,543 B2 | 5/2006 | Ewing et al. |
| 7,092,258 B2 | 8/2006 | Hardt et al. |
| 7,097,047 B2 | 8/2006 | Lee et al. |
| 7,141,891 B2 | 11/2006 | McNally et al. |
| 7,171,461 B2 | 1/2007 | Ewing et al. |
| D549,650 S | 8/2007 | Russell et al. |
| 7,268,998 B2 | 9/2007 | Ewing et al. |
| 7,312,980 B2 | 12/2007 | Ewing et al. |
| D559,184 S | 1/2008 | Russell et al. |
| D562,766 S | 2/2008 | Yang |
| D564,964 S | 3/2008 | Caine et al. |
| 7,345,241 B2 | 3/2008 | Caveney et al. |
| 7,352,947 B2 | 4/2008 | Phung et al. |
| 7,362,941 B2 | 4/2008 | Rinderer et al. |
| 7,365,964 B2 | 4/2008 | Donahue, IV |
| D575,237 S | 8/2008 | Shiga et al. |
| D576,552 S | 9/2008 | Caine et al. |
| 7,540,749 B1 | 6/2009 | Hall et al. |
| 7,559,788 B2 | 7/2009 | Legg |
| 7,567,430 B2 | 7/2009 | Ewing et al. |
| 7,637,771 B2 | 12/2009 | Laursen |
| 7,661,982 B2 | 2/2010 | Tachi et al. |
| 7,702,771 B2 | 4/2010 | Ewing et al. |
| 7,712,709 B2 | 5/2010 | Winchester |
| 7,777,365 B2 | 8/2010 | Cleveland et al. |
| 7,789,679 B2 | 9/2010 | Wu et al. |
| D631,731 S | 2/2011 | Chen |
| 7,891,993 B2 | 2/2011 | Huber et al. |
| 7,974,105 B2 | 7/2011 | Dean, Jr. et al. |
| 8,025,525 B2 | 9/2011 | Krueger et al. |
| 8,033,867 B1 | 10/2011 | Kessler et al. |
| D660,235 S | 5/2012 | Liang-Hsu et al. |
| 8,238,080 B2 | 8/2012 | McGinn |
| 8,263,867 B2 | 9/2012 | Garza et al. |
| D677,629 S | 3/2013 | Corona |
| D678,200 S | 3/2013 | Corona |
| D678,202 S | 3/2013 | Corona |
| 8,411,465 B2 | 4/2013 | Dean, Jr. et al. |
| 8,437,147 B2 | 5/2013 | Dean, Jr. et al. |
| D687,778 S | 8/2013 | Utz |
| 8,529,288 B2 | 9/2013 | Montena et al. |
| 8,764,480 B2 | 7/2014 | Natoli et al. |
| 8,882,536 B2 | 11/2014 | Utz |
| 9,106,003 B2 | 8/2015 | Anderson et al. |
| 9,306,313 B2 | 4/2016 | Heggemann et al. |
| 9,509,086 B2 | 11/2016 | Utz et al. |
| 9,531,126 B2 | 12/2016 | Krietzman et al. |
| 9,531,129 B2 | 12/2016 | de Boer |
| 9,844,143 B2 * | 12/2017 | Utz ..................... H05K 3/325 |
| 2001/0002689 A1 | 6/2001 | Shelton et al. |

(56) References Cited

U.S. PATENT DOCUMENTS

| | | |
|---|---|---|
| 2001/0030266 A1 | 10/2001 | MacDonald et al. |
| 2002/0176681 A1 | 11/2002 | Puetz et al. |
| 2004/0077212 A1 | 4/2004 | Pulizzi |
| 2004/0146266 A1 | 7/2004 | Solheid et al. |
| 2005/0057912 A1 | 3/2005 | Hardt et al. |
| 2005/0259383 A1 | 11/2005 | Ewing |
| 2006/0118685 A1 | 6/2006 | Schluter et al. |
| 2006/0154503 A1 | 7/2006 | Kidman |
| 2007/0049099 A1 | 3/2007 | Potters |
| 2008/0180917 A1 | 7/2008 | Lawrence |
| 2008/0248697 A1 | 10/2008 | Whiteman et al. |
| 2009/0038845 A1 | 2/2009 | Fransen et al. |
| 2009/0273915 A1 | 11/2009 | Dean, Jr. et al. |
| 2010/0193754 A1 | 8/2010 | Garza et al. |
| 2010/0200707 A1 | 8/2010 | Garza et al. |
| 2010/0296229 A1 | 11/2010 | Meux et al. |
| 2011/0056895 A1 | 3/2011 | Tichy |
| 2011/0211328 A1 | 9/2011 | Dean, Jr. et al. |
| 2011/0211329 A1 | 9/2011 | Dean, Jr. et al. |
| 2011/0223784 A1 | 9/2011 | Jiang et al. |
| 2013/0040485 A1 | 2/2013 | Ngo |
| 2013/0196532 A1 | 8/2013 | Utz et al. |
| 2013/0196535 A1 | 8/2013 | Utz |
| 2013/0215581 A1 | 8/2013 | Utz |
| 2015/0222047 A1 | 8/2015 | Utz et al. |
| 2015/0357758 A1 | 12/2015 | Krietzman et al. |
| 2016/0211611 A1 | 7/2016 | Cruz |
| 2017/0042030 A1 | 2/2017 | Utz |
| 2017/0077649 A1 | 3/2017 | Utz et al. |
| 2017/0104294 A1 | 4/2017 | Krietzman et al. |

FOREIGN PATENT DOCUMENTS

| | | |
|---|---|---|
| WO | 1999018580 A2 | 4/1999 |
| WO | 2009089008 A2 | 7/2009 |
| WO | 2015188116 A1 | 12/2015 |

OTHER PUBLICATIONS

Specification from WIREMOLD.com—Plug-In Outlet Center® Units—ED795R4, updated Mar. 2003 (8 pages).

Wikipedia entry for "IEC 60320," retrieved May 6, 2014 (11 pages).

* cited by examiner

BOARD-MOUNTED CIRCUIT BREAKERS FOR ELECTRONIC EQUIPMENT ENCLOSURES

CROSS-REFERENCE TO RELATED APPLICATIONS

The present application is a U.S. continuation patent application of, and claims priority under 35 U.S.C. § 120 to, U.S. nonprovisional patent application Ser. No. 15/202,690, filed Jul. 6, 2016, which published on Feb. 9, 2017 as U.S. Patent Application Publication No. US 2017/0042030 A1, which '690 application issued as U.S. Pat. No. 9,844,143 on Dec. 12, 2017, which '690 application, the application publication thereof, and the patent issuing therefrom are each incorporated by reference herein in their entirety, and which '690 application is a U.S. continuation patent application of, and claims priority under 35 U.S.C. § 120 to, U.S. nonprovisional patent application Ser. No. 13/751,117, filed Jan. 27, 2013, which published on Aug. 22, 2013 as U.S. Patent Application Publication No. US 2013/0215581 A1, which '117 application and the application publication thereof are each incorporated by reference herein in their entirety, and which '117 application is a U.S. nonprovisional patent application of, and claims priority under 35 U.S.C. § 119(e) to, U.S. provisional patent application Ser. No. 61/591,342, filed Jan. 27, 2012, which '342 application is incorporated by reference herein in its entirety. Additionally, the entirety of each of the following commonly-assigned U.S. patent applications, and any application publication thereof, is expressly incorporated herein by reference:

(a) U.S. provisional patent application Ser. No. 61/591,369, filed Jan. 27, 2012, and entitled, "POWER DISTRIBUTION UNIT WITH INTERCHANGEABLE RECEPTACLE TYPES;"

(b) U.S. provisional patent application Ser. No. 61/591,379, filed Jan. 27, 2012, and entitled, "CABLE RETENTION SYSTEM FOR POWER DISTRIBUTION UNIT;"

(c) U.S. nonprovisional patent application Ser. No. 13/751,118, filed Jan. 27, 2013, published on Aug. 1, 2013 as U.S. Patent Application Publication No. US 2013/0196535 A1, and entitled, "POWER DISTRIBUTION UNIT WITH INTERCHANGEABLE OUTLET ADAPTER TYPES;" and (d) U.S. nonprovisional patent application Ser. No. 13/751,119, filed Jan. 27, 2013, published on Aug. 1, 2013 as U.S. Patent Application Publication No. US 2013/0196532 A1, and entitled, "CABLE RETENTION SYSTEM FOR POWER DISTRIBUTION UNIT."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to circuit breakers in electronic equipment enclosures, and, in particular, to board-mounted circuit breakers for power distribution units in electronic equipment enclosures.

Background

Cabinets, including rack frame cabinets and other electronic equipment enclosures, are commonly used for storing equipment, often electrical equipment such as computer and telecommunications equipment with multiple components. It naturally follows that the multi-component electrical equipment being stored in cabinets requires multiple sources of power, and that power distribution units may be provided to facilitate this. As used herein, a "power distribution unit" shall be understood to mean a unitary or semi-unitary structure containing multiple power receptacles or outlets. In typical power distribution units (PDUs), the multiple receptacles or outlets are arranged in one or more rows or columns.

Many power distribution units include, or are used in conjunction with, one or more circuit breakers. Circuit breakers are typically breakers connected with wires and screw terminals. Unfortunately, installing such circuit breakers is time-consuming and tedious. In addition, this approach requires many connections per line and further requires reparative connections for each terminal.

Furthermore, the overall "z" height of known circuit breakers (i.e., the height of the circuit breakers above, or extending from, the surface of the printed circuit board or other structure on which they are mounted) is prohibitive. Overall "z" height and length in PDU products are a primary constraint in network cabinets. "Z" height restricts access to the rear of computer equipment, blocks air flow and affects required cabinet width. Furthermore, the length of a PDU can affect minimum cabinet height supported and will not work on a majority of applications if it exceeds 42 RMU (1.75"×42=73.5"), including necessary cord bend radius space.

Thus, a need exists for a circuit breaker design that reduces assembly time, reduces "z" height and/or length, and reduces component count.

SUMMARY OF THE PRESENT INVENTION

The present invention comprises a board-mounted circuit breaker assembly for power distribution units in electronic equipment enclosures.

Broadly defined, the present invention according to one aspect is a board-mounted circuit breaker assembly for an electronic equipment enclosure, as shown and described.

Broadly defined, the present invention according to another aspect is a method of installing circuit breakers on a board for an electronic equipment enclosure, as shown and described.

Broadly defined, the present invention according to another aspect is a power distribution unit, for an electronic equipment enclosure, having a board-mounted circuit breaker assembly as shown and described.

Broadly defined, the present invention according to another aspect is a board-mounted circuit breaker assembly for an electronic equipment enclosure, including: a printed circuit board having a plurality of quick-connect terminals; and a circuit breaker having a housing and a plurality of quick-connect terminals, adapted to electrically connect to the quick-connect terminals on the printed circuit board, that are recessed into a portion of the housing to reduce the overall "z"-height of the circuit breaker.

In a feature of this aspect, the quick-connect terminals recessed into the housing of the circuit breaker are male quick-connect terminals.

In another feature of this aspect, the circuit breaker includes a plurality of circuit breakers. In a further feature, a bracket is disposed between adjacent circuit breakers and is positioned a distance from the printed circuit board by spacers.

In another feature of this aspect, the board-mounted circuit breaker assembly further includes a cover. In further features, the cover is positioned a distance from the printed circuit board by spacers; and/or the cover is fastened directly to the circuit breaker.

Broadly defined, the present invention according to another aspect is a method of installing circuit breakers on a board for an electronic equipment enclosure, including: providing a circuit breaker, having a housing and a plurality of quick-connect terminals; and installing the circuit breaker into a printed circuit board, having a plurality of quick-connect terminals, such that the act of coupling the quick-connect terminals of the circuit breaker to the quick-connect terminals of the printed circuit board both mounts the circuit breaker on the printed circuit board and electrically connects the circuit breaker inline to the printed circuit board.

Broadly defined, the present invention according to another aspect is a circuit breaker-equipped electronic equipment enclosure, including: an electronic equipment enclosure; electronic equipment mounted within the electronic equipment enclosure; and a board-mounted circuit breaker assembly, mounted within the electronic equipment enclosure and utilized in relation to the electronic equipment. The board-mounted circuit breaker assembly includes a printed circuit board, having a plurality of quick-connect terminals disposed on a mounting surface thereof, and a plurality of circuit breakers, each having a housing and a plurality of quick-connect terminals, wherein the quick-connect terminals are adapted to mechanically and electrically connect to the quick-connect terminals on the printed circuit board, and are each at least partially recessed into a portion of the housing to reduce the overall height of the circuit breaker above the mounting surface.

Broadly defined, the present invention according to another aspect is a board-mounted circuit breaker assembly for an electronic equipment enclosure, including: a printed circuit board having a plurality of quick-connect terminals disposed on a mounting surface thereof; and a circuit breaker having a housing, and a plurality of quick-connect terminals, adapted to mechanically and electrically connect to the quick-connect terminals on the printed circuit board, that are each at least partially recessed into a portion of the housing to reduce the overall height of the circuit breaker above the mounting surface.

In features of this aspect, the quick-connect terminals recessed into the housing of the circuit breaker are male quick-connect terminals; the quick-connect terminals on the printed circuit board are female quick-connect terminals; each of the quick-connect terminals of the circuit breaker is entirely recessed into a portion of the housing such that no portion of the quick-connect terminals extend past the rearmost, printed circuit board-facing surface of the housing; the plurality of quick-connect terminals of the circuit breaker includes four quick-connect terminals; and/or the four quick-connect terminals of the circuit breaker are arranged at ends of the housing.

In further features of this aspect, the circuit breaker includes a plurality of circuit breakers. In a further feature, a bracket is disposed between adjacent circuit breakers and is positioned a distance from the printed circuit board by at least one spacer. In still further features, the board-mounted circuit breaker assembly further includes a cover that extends over the plurality of circuit breakers; the cover is positioned a distance from the printed circuit board by spacers; the cover is fastened to the at least one spacer by a first fastener and the at least one spacer is fastened to the printed circuit board by a second fastener; and/or the cover is fastened directly to the circuit breakers.

Broadly defined, the present invention according to another aspect a method of installing circuit breakers on a printed circuit board for an electronic equipment enclosure, including: providing at least one circuit breaker having a housing and a plurality of quick-connect terminals; and installing the at least one circuit breaker onto a printed circuit board, having a plurality of quick-connect terminals disposed on a mounting surface thereof, such that the act of coupling the quick-connect terminals of the at least one circuit breaker to the quick-connect terminals of the printed circuit board both mechanically mounts the at least one circuit breaker on the printed circuit board and electrically connects the at least one circuit breaker inline to the printed circuit board.

In a feature of this aspect, the method further includes fastening a cover directly to the at least one circuit breaker with mechanical fasteners. In a further feature, the method further includes positioning the cover a distance from the printed circuit board with spacers, fastening the cover to the spacers, and fastening the spacers to the printed circuit board.

In a another feature of this aspect, the quick-connect terminals of the at least one circuit breaker are male quick-connect terminals.

In another feature of this aspect, the quick-connect terminals on the printed circuit board are female quick-connect terminals.

In another feature of this aspect, the quick-connect terminals of the at least one circuit breaker are each at least partially recessed into a portion of the housing to reduce the overall height of the circuit breaker above the mounting surface. In a further feature, each of the quick-connect terminals of the at least one circuit breaker is entirely recessed into a portion of the housing such that no portion of the quick-connect terminals extend past the rearmost, printed circuit board-facing surface of the housing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
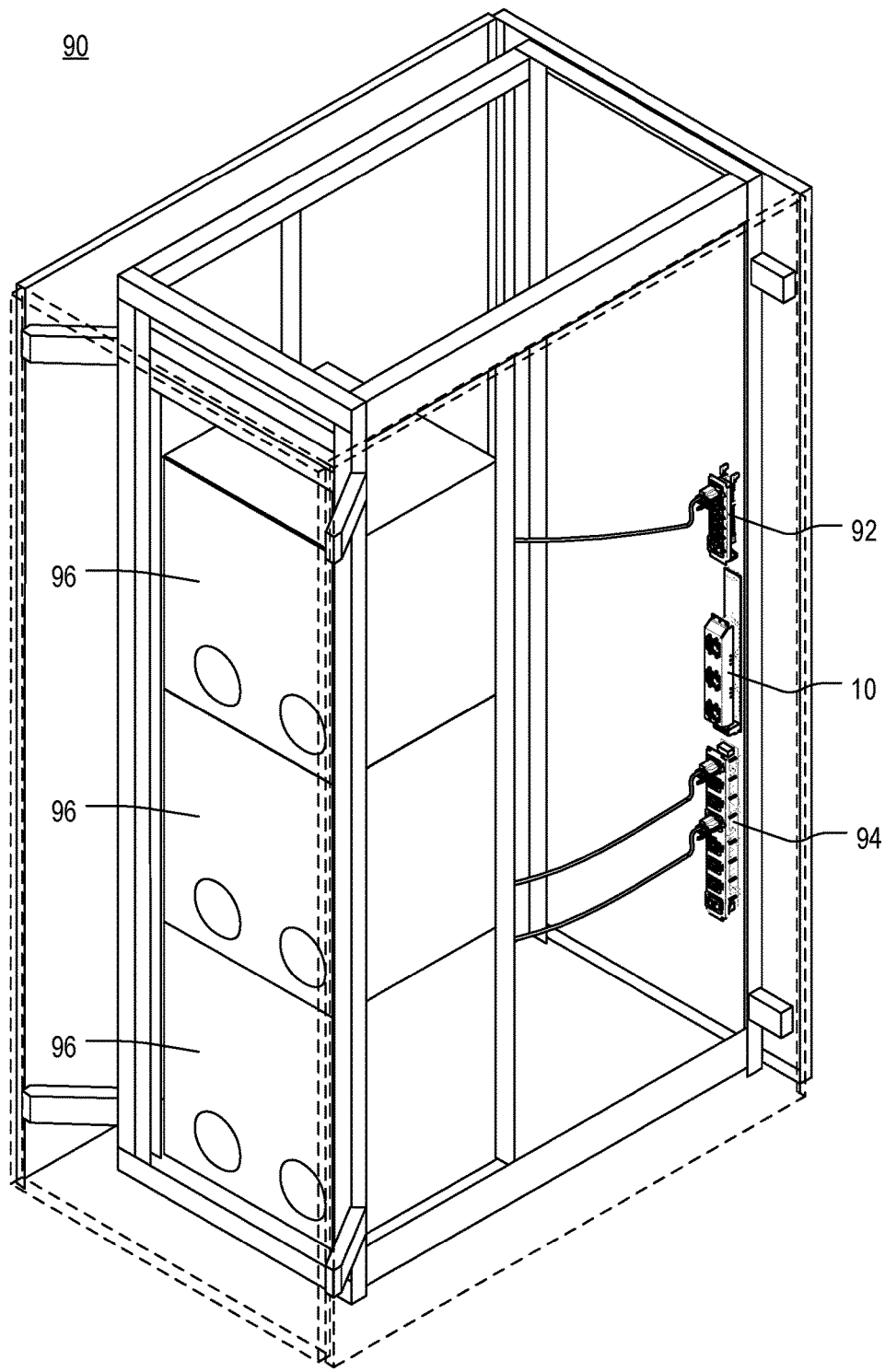
FIG. 1 is a partially schematic front isometric view of an electronic equipment enclosure having a board-mounted circuit breaker assembly mounted therein in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. § 112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

FIG. 1 is a partially schematic front isometric view of an electronic equipment enclosure 90 having a board-mounted circuit breaker assembly 10 mounted therein in accordance with one or more preferred embodiments of the present invention. The board-mounted circuit breaker assembly 10 may be part of a electrical supply system that also includes such devices as power distribution units 92,94. The electrical supply system has a general purpose of providing power to electronic equipment, such as servers 96, that is installed in the enclosure 90.

Figure 2:
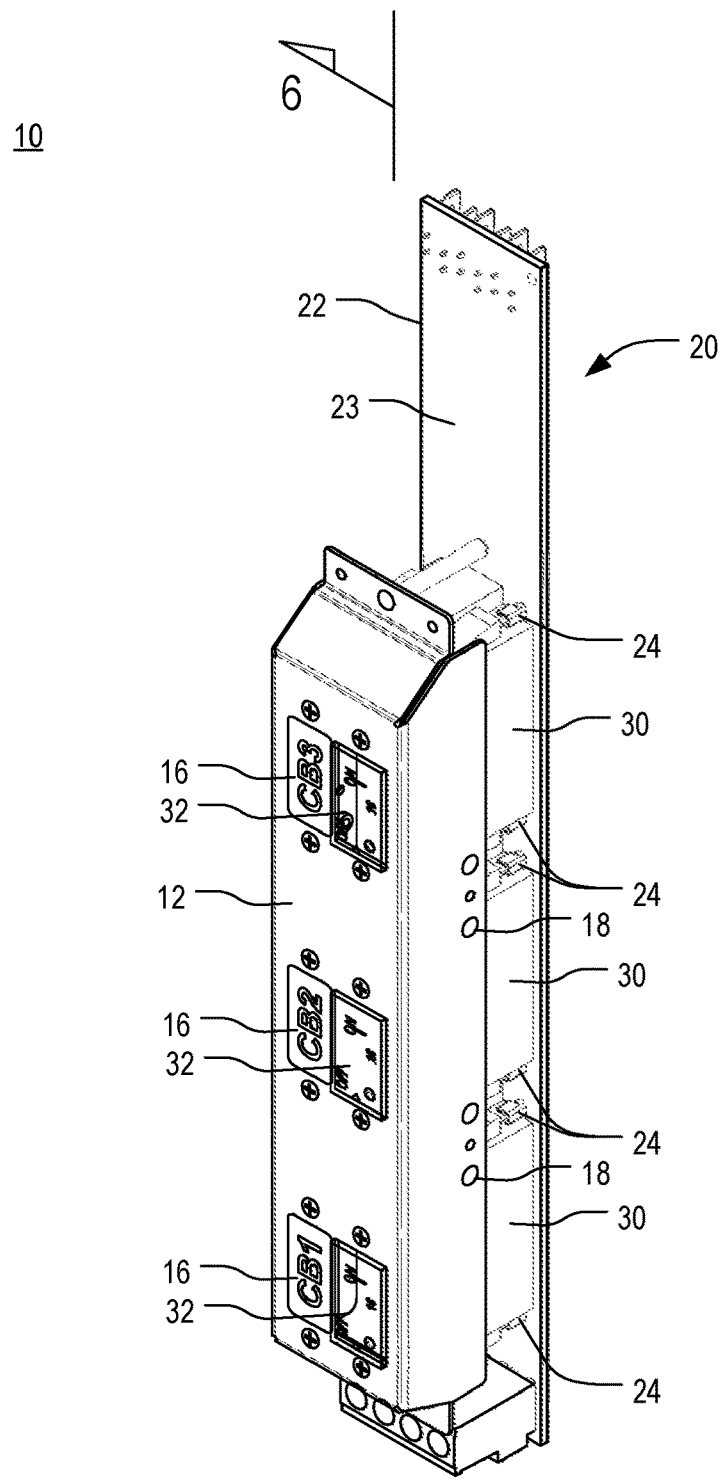
FIG. 2 is a front isometric view of the board-mounted circuit breaker assembly of FIG. 1 in accordance with one or more preferred embodiments of the present invention.

FIG. 2 is a front isometric view of the board-mounted circuit breaker assembly 10 of FIG. 1 in accordance with one or more preferred embodiments of the present invention. As shown therein, the circuit-breaker assembly 10 includes a board assembly 20, a plurality of circuit breakers 30, and a cover 12, which may include an identification 16, such as labels, graphics, a display, or the like, for each circuit breaker 30. Among other elements, the board assembly 20 includes a printed circuit board (PCB) 22 and a plurality of female electrical terminals 24 extending from a mounting surface 23 thereof. Each circuit beaker 30 is mounted directly to the PCB 22 via a respective set of female terminals 24. The board-mounted circuit breaker assembly 10 may be utilized in or with any suitable power distribution unit in an electronic equipment enclosure 90, including, for example, the power distribution units 92,94 shown in FIG. 1. Such power distribution units 92,94 are described in co-pending, commonly-assigned U.S. nonprovisional patent application Ser. Nos. 13/751,118 and 13/751,119, each of which is incorporated by reference herein in its entirety.

Figure 3:
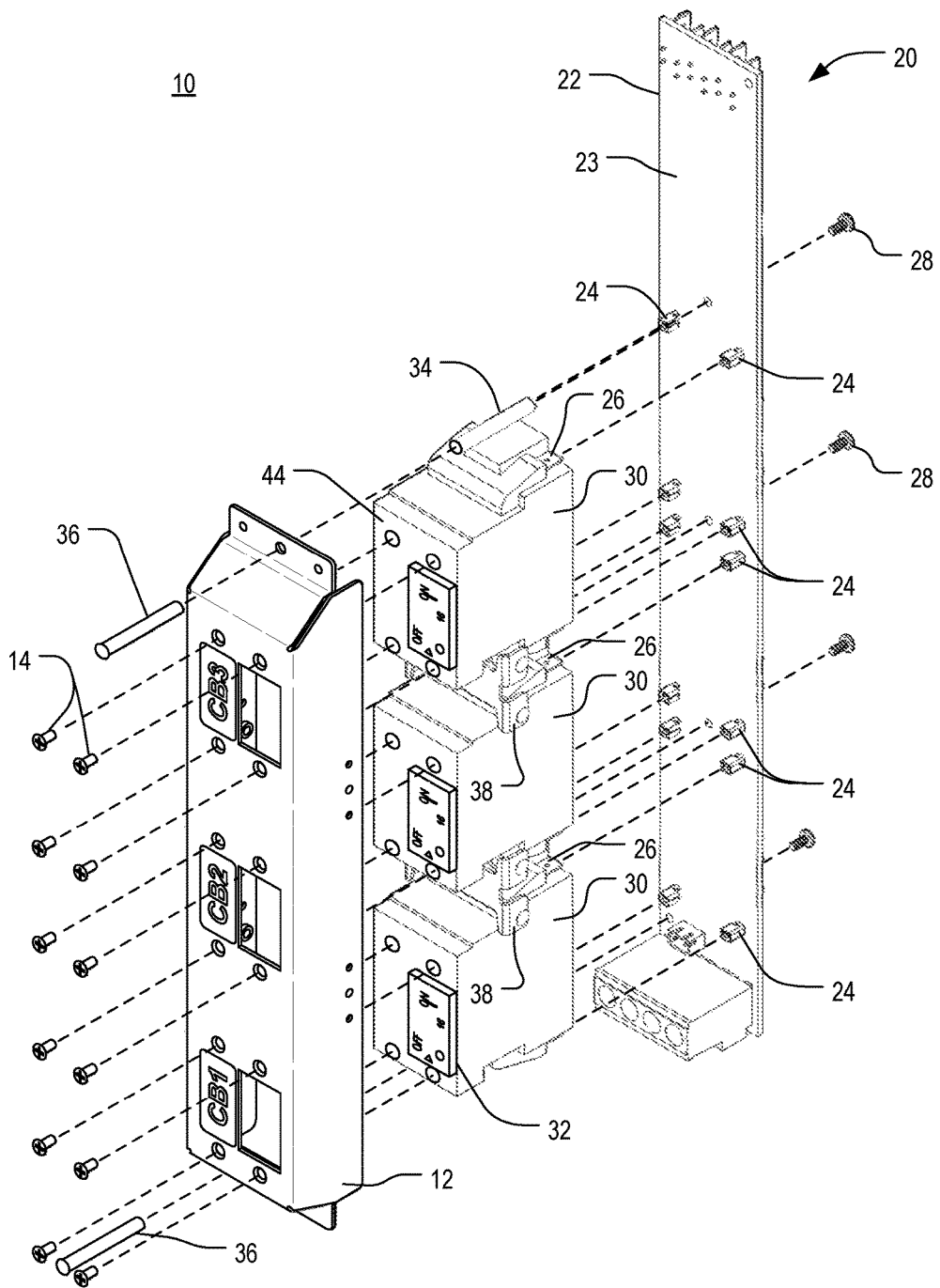
FIG. 3 is an exploded isometric view of the board-mounted circuit breaker assembly of FIG. 2.

FIG. 3 is an exploded isometric view of the board-mounted circuit breaker assembly 10 of FIG. 2. With reference to FIGS. 2 and 3, three circuit breakers 30 are mountable to the board assembly 20 via male electrical terminals 26 located on the rear or underside of each circuit breaker 30. In particular, each circuit breaker 30 includes four male terminals 26 that may be inserted into a corresponding set of female terminals 24 disposed on the PCB 22. The circuit breakers 30 are further held in place by the cover 12, which is attached to the front or top of the circuit breakers 30 via fasteners 14. As will be further described below, the cover 12 is also attached to the board assembly 20 via butterfly brackets 38, spacers 34, and various fasteners 18,28,36.

Figure 4:
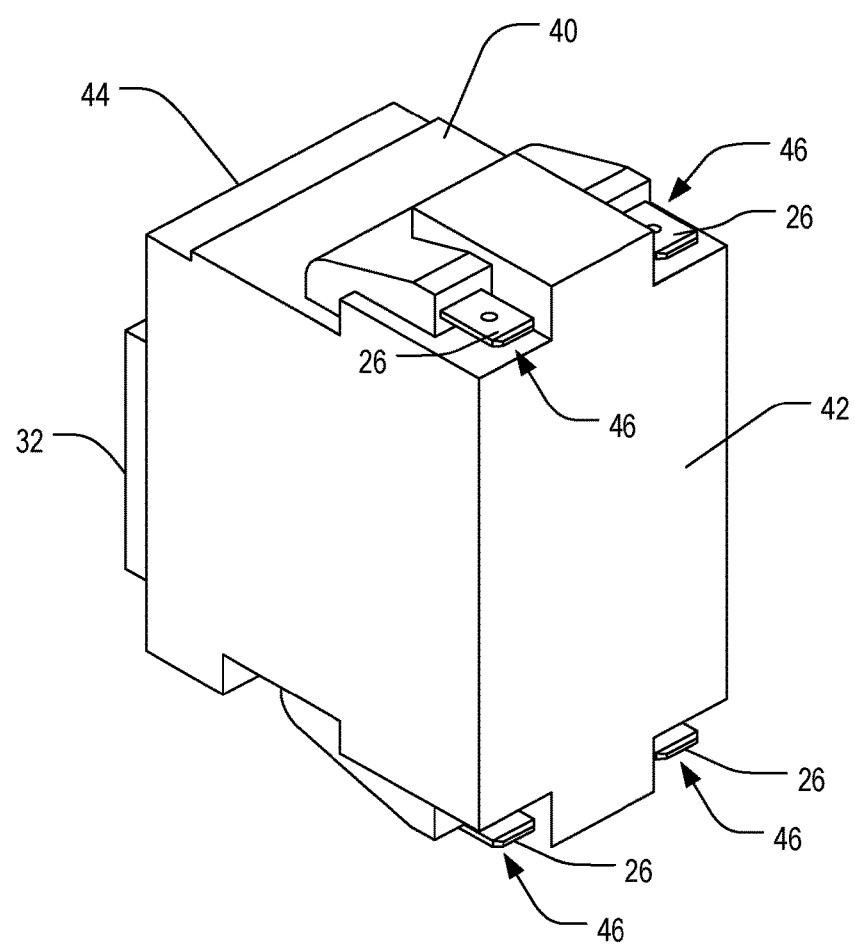
FIG. 4 is a rear isometric view of one of the circuit breakers of FIG. 2.
Figure 5:
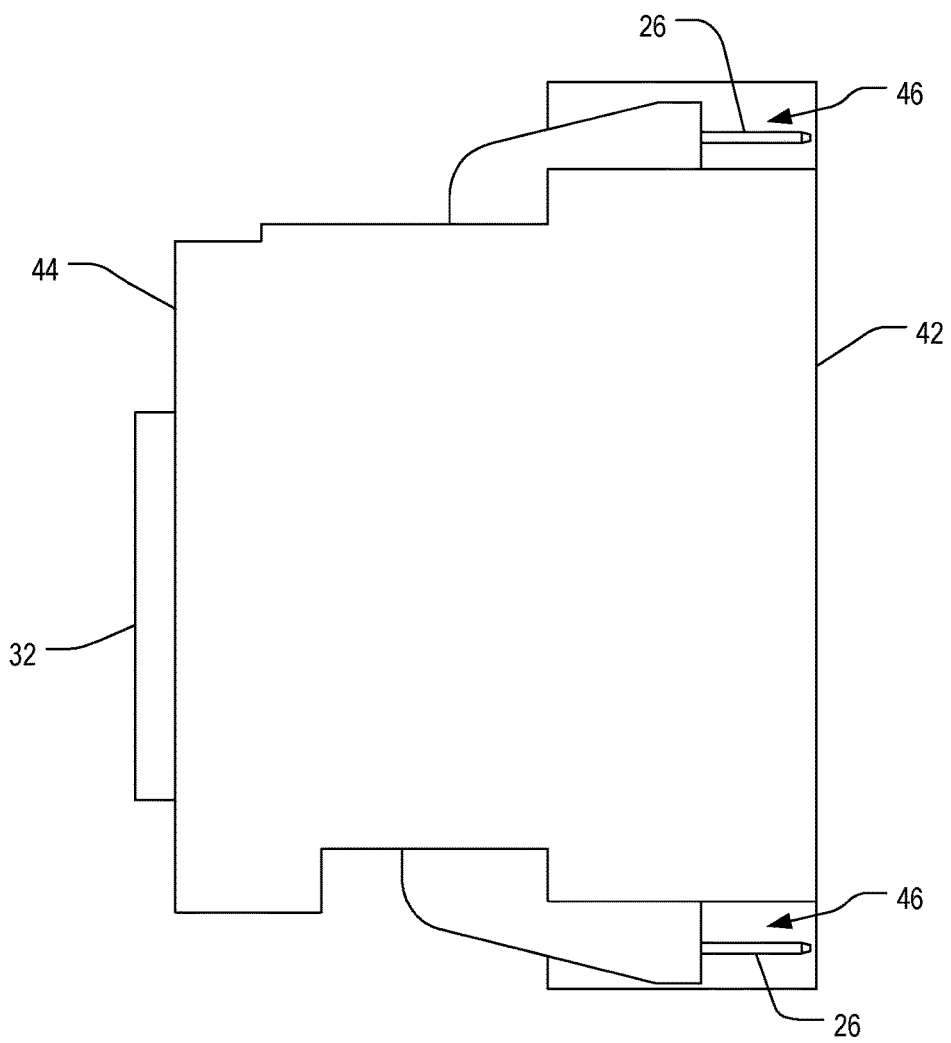
FIG. 5 is a side view of the circuit breaker of FIG. 4.

FIG. 4 is a rear isometric view of one of the circuit breakers 30 of FIG. 2, and FIG. 5 is a side view of the circuit breaker 30 of FIG. 4. With reference to FIGS. 2-4, each circuit breaker 30 includes a housing 40, which includes various surfaces, particularly including a rear surface 42 and a front surface 44. A control interface 32 for the circuit breaker is disposed on the front surface 44 of the housing 40, and corresponding openings are provided in the cover 12 to accommodate such interfaces 32. As perhaps best shown in FIG. 4, the four male electrical terminals 26 are arranged at ends of the housing 40 and are oriented to point directly toward the female terminals 24 that extend from the PCB 22. Notably, each male terminal 26 is recessed within a hollow 46 and sized to accommodate a respective female terminal 24 when connected thereto. In this arrangement, the end of each terminal 26 is entirely recessed behind the rear surface 42 of the housing 40, and thus the housing 40 as a whole takes up a minimum of space in front of or above the PCB 22.

It will be appreciated that, although one type of male terminal and corresponding female terminal are illustrated, other types of male and female terminals may likewise be utilized in at least some embodiments, as long as the terminals on the circuit breaker are recessed into a portion of the housing. Furthermore, the locations of the male and female terminals may be reversed such that the female terminals are on the circuit breaker and the male terminals are on the PCB. Still further, in some embodiments, the terminals may be disposed at the front of the circuit breaker instead of at the rear.

Figure 6:
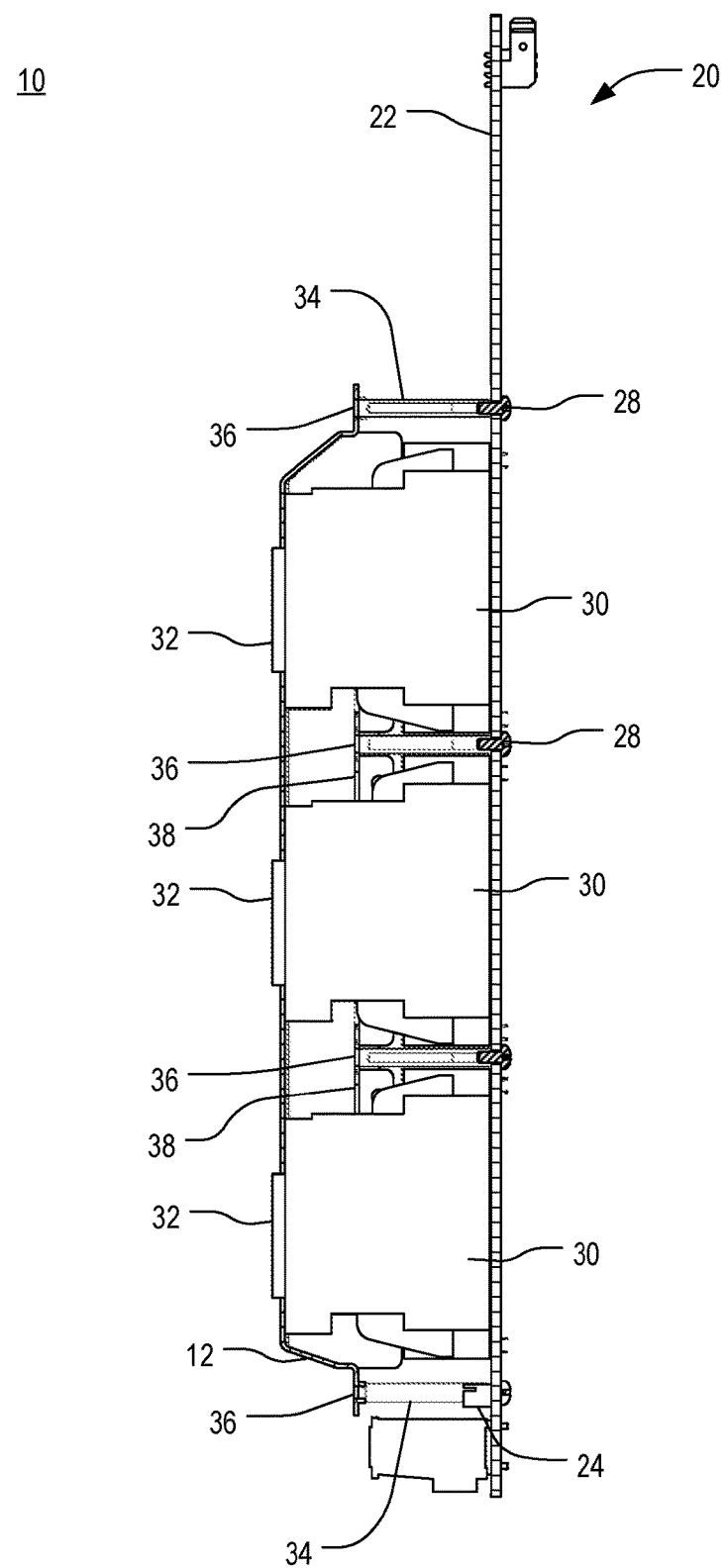
FIG. 6 is a side cross-sectional view of the board-mounted circuit breaker assembly of FIG. 2, taken along line 6-6.

Further assembly details are provided in FIG. 6, which is a side cross-sectional view of the board-mounted circuit breaker assembly of FIG. 2, taken along line 6-6. With particular reference to FIGS. 2, 3 and 6, the butterfly brackets 38 are positioned at a defined distance away from the PCB 22 by spacers 34. A first fastener 36 is used to attach each butterfly bracket 38 to a respective spacer 34, and a second fastener 28 is used to attach the spacer 34 to the PCB 22. Similarly, ends of the cover 12 are positioned at a defined distance away from the PCB 22 by spacers 34. A first fastener 36 is used to attach each end of the cover 12 to a respective spacer 34, and a second fastener 28 is used to attach the spacer 34 to the PCB 22. Furthermore, as described previously, the cover 12 is also attached to the front surfaces 44 of the breakers 30 via fasteners 14. In at least some embodiments, as the butterfly brackets 38 are installed and the fasteners 36 are tightened, the butterfly brackets 38 may engage surfaces of the circuit breakers 30.

In at least some embodiments, the spacers 34 are electrically nonconductive, and thus help to electrically isolate the cover 12 from the printed circuit board 22. This may be achieved by fastening the cover 12 to the spacers 34 using first fasteners 36 and fastening the spacers 34 to the printed circuit board 22 using second fasteners 28. The spacers 34 may be internally threaded at each end to facilitate such arrangement.

In various embodiments, the circuit breakers may have wire connections or other board mounted terminals; the circuit breakers may have a screw terminal with a through hole on the board that contacts a contact pad; all connections may be made in by one or more assembly directions; or connections may be staged to allow incremental engagement for ease of assembly.

Advantageously, the design described and illustrated herein creates an abbreviated interface (i.e., the male terminals 26 on the circuit breakers 30 are coupled to the female terminals 24 of the PCB 20, and no other connections are made) between the circuit breakers 30 and the printed circuit board 22. This, in turn, eliminates wires, reduces assembly time and minimizes the "z" height (i.e., the height of the circuit breakers above, or extending from, the surface of the PCB 22) of the final product.

Furthermore, the arrangement allows the connection of multiple line connections by having fixed terminal locations that obtain electrical continuity upon part assembly. In other words, the step of connecting electrical connections is combined with the step of mechanical part assembly.

Still further, direct connection of the board allows easy integration of board mount measurement devices in the system, and allows easy integration of board mount monitoring, control and graphics devices in the system.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A circuit breaker-equipped electronic equipment enclosure system, comprising:
   an electronic equipment enclosure;
   electronic equipment mounted within the electronic equipment enclosure; and
   a board-mounted circuit breaker assembly mounted within the electronic equipment enclosure and utilized in relation to the electronic equipment, the board-mounted circuit breaker assembly including
      a printed circuit board having a plurality of printed circuit board quick-connect terminals disposed on a mounting surface thereof, and
      at least one circuit breaker having a housing body and a plurality of circuit breaker quick-connect terminals adapted to mechanically and electrically connect to the plurality of printed circuit board quick-connect terminals;
   wherein the housing body includes a rear surface facing the mounting surface of the printed circuit board and a plurality of hollows that are arranged laterally along the rear surface, each hollow of the plurality of hollows extending into the housing body such that at least a portion of the rear surface is disposed between a first hollow of the plurality of hollows and a second, laterally-adjacent hollow of the plurality of hollows; and
   wherein each of the plurality of circuit breaker quick-connect terminals is entirely recessed into a respective one of the plurality of hollows such that no portion of such circuit breaker quick-connect terminal extends past the portion of the rear surface of the housing body that is disposed between the first and second hollows, thereby reducing an overall height of the at least one circuit breaker above the mounting surface.

2. The circuit breaker-equipped electronic equipment enclosure system of claim 1, wherein the circuit breaker quick-connect terminals are male quick-connect terminals.

3. The circuit breaker-equipped electronic equipment enclosure system of claim 1, wherein the printed circuit board quick-connect terminals are female quick-connect terminals.

4. The circuit breaker-equipped electronic equipment enclosure system of claim 1, further comprising a cover extending over the at least one circuit breaker.

5. The circuit breaker-equipped electronic equipment enclosure system of claim 4, wherein the cover is positioned a distance from the printed circuit board by at least one spacer.

6. A board-mounted circuit breaker assembly for an electronic equipment enclosure, comprising:
   a printed circuit board having a plurality of printed circuit board quick-connect terminals disposed on, and protruding away from, a mounting surface thereof; and
   a circuit breaker including
      a housing body having a rear surface, facing the mounting surface of the printed circuit board, and a plurality of hollows arranged laterally along the rear surface, each hollow of the plurality of hollows extending into the housing body such that at least a portion of the rear surface is disposed between a first hollow of the plurality of hollows and a second, laterally-adjacent hollow of the plurality of hollows, and
      a plurality of circuit breaker quick-connect terminals adapted to mechanically and electrically connect to the printed circuit board quick-connect terminals, each of the plurality of circuit breaker quick-connect terminals being entirely recessed into a respective one of the plurality of hollows such that no portion of such circuit breaker quick-connect terminal extends past the portion of the rear surface of the housing body that is disposed between the first and second hollows, thereby reducing an overall height of the circuit breaker above the mounting surface.

7. The board-mounted circuit breaker assembly of claim 6, wherein the circuit breaker quick-connect terminals are male quick-connect terminals.

8. The board-mounted circuit breaker assembly of claim 6, wherein the printed circuit board quick-connect terminals are female quick-connect terminals.

9. The board-mounted circuit breaker assembly of claim 6, wherein the plurality of circuit breaker quick-connect terminals includes four circuit breaker quick-connect terminals.

10. The board-mounted circuit breaker assembly of claim 9, wherein the four circuit breaker quick-connect terminals are arranged at ends of the housing body.

11. The board-mounted circuit breaker assembly of claim 6, wherein the circuit breaker includes a plurality of circuit breakers.

12. The board-mounted circuit breaker assembly of claim 11, wherein a bracket is disposed between adjacent ones of the plurality of circuit breakers and is positioned a distance from the printed circuit board by spacers.

13. The board-mounted circuit breaker assembly of claim 11, further comprising a cover extending over the plurality of circuit breakers.

14. The board-mounted circuit breaker assembly of claim 13, wherein the cover is positioned a distance from the printed circuit board by at least one spacer.

15. The board-mounted circuit breaker assembly of claim 14, wherein the cover is fastened to the at least one spacer by a first fastener and the at least one spacer is fastened to the printed circuit board by a second fastener.

16. The board-mounted circuit breaker assembly of claim 13, wherein the cover is fastened directly to one or more of the plurality of circuit breakers.

17. A board-mounted circuit breaker assembly for an electronic equipment enclosure, comprising:
   a printed circuit board having a plurality of printed circuit board quick-connect terminals disposed on, and protruding away from, a mounting surface thereof; and
   a circuit breaker including
      a housing body having a generally planar rear surface facing the mounting surface of the printed circuit board, and
      a plurality of circuit breaker quick-connect terminals adapted to mechanically and electrically connect to the printed circuit board quick-connect terminals, each of the plurality of circuit breaker quick-connect terminals being entirely recessed, independently, in a corresponding hollow of the housing body such that an outermost distal end of each circuit breaker quick-connect terminal does not extend beyond a plane defined by the rear surface, thereby reducing an overall height of the circuit breaker above the mounting surface.

18. The board-mounted circuit breaker assembly of claim 17, wherein the circuit breaker quick-connect terminals are male quick-connect terminals.

19. The board-mounted circuit breaker assembly of claim 17, wherein the printed circuit board quick-connect terminals are female quick-connect terminals.

20. The board-mounted circuit breaker assembly of claim 17, wherein each of the plurality of printed circuit board quick-connect terminals is disposed such that the housing body only partially surrounds each of the plurality of printed circuit board quick-connect terminals as viewed in a projected view of the rear surface of the housing body.

* * * * *